United States Patent

Anda et al.

[11] Patent Number: 6,153,499
[45] Date of Patent: Nov. 28, 2000

[54] METHOD OF MANUFACTURING SEMICONDUCTOR DEVICE

[75] Inventors: Yoshiharu Anda, Osaka; Toshinobu Matsuno, Kyoto; Katsunori Nishii, Osaka; Kaoru Inoue, Shiga; Manabu Yanagihara; Mitsuru Tanabe, both of Osaka, all of Japan

[73] Assignee: Matsushita Electric Industrial Co., Ltd., Osaka, Japan

[21] Appl. No.: 09/289,946

[22] Filed: Apr. 13, 1999

[30] Foreign Application Priority Data

Apr. 22, 1998 [JP] Japan ................................. 10-111682

[51] Int. Cl.⁷ ............................. H01L 21/28; H01L 21/44
[52] U.S. Cl. ........................ 438/579; 438/574; 438/182; 438/640; 438/949
[58] Field of Search .................................. 438/573–574, 438/578–579, 948–952, 167, 182, 640, 673; 430/312–313

[56] References Cited

U.S. PATENT DOCUMENTS

| | | | |
|---|---|---|---|
| 4,283,483 | 8/1981 | Coane ...................................... | 438/577 |
| 4,337,115 | 6/1982 | Kikeda et al. ........................... | 438/670 |
| 5,006,478 | 4/1991 | Kobayashi et al. ..................... | 438/577 |
| 5,583,063 | 12/1996 | Anda et al. .............................. | 438/167 |
| 5,766,967 | 6/1998 | Lai et al. ................................. | 438/167 |
| 5,776,805 | 7/1998 | Kim ........................................ | 438/182 |
| 5,858,824 | 1/1999 | Saitoh ..................................... | 438/167 |
| 5,930,610 | 7/1999 | Lee ......................................... | 438/182 |
| 6,051,454 | 4/2000 | Anda et al. .............................. | 438/167 |

FOREIGN PATENT DOCUMENTS 05152294  6/1993  Japan .

*Primary Examiner*—Charles Bowers
*Assistant Examiner*—Thanh Nguyen
*Attorney, Agent, or Firm*—McDermott, Will & Emery

[57] ABSTRACT

A first resist film for EB exposure, a buffer film, and a second resist film for i-line exposure are applied sequentially onto a substrate. Thereafter, the second resist film and the buffer film are subjected to patterning for forming a first opening. Then, dry etching is performed with respect to the first resist film masked with the second resist film to transfer the pattern of the second resist film to the first resist film and thereby form a second opening in the first resist film. Subsequently, a third resist film of chemically amplified type is applied to the entire surface of the first resist film to form a mixing layer in conjunction with the first resist film. As a result, the wall faces of the second opening are covered with the mixing layer and the width of the second opening is thereby reduced.

12 Claims, 9 Drawing Sheets

METHOD OF MANUFACTURING SEMICONDUCTOR DEVICE

BACKGROUND OF THE INVENTION

The present invention relates to a method of manufacturing a semiconductor device and, more particularly, to a method of manufacturing a semiconductor device with a gate length or line width that has been reduced to the order of 0.1 to 0.2 μm.

With recent tendencies toward an increasingly advancing information-oriented society, the milliwave band in which frequencies are 30 GHz and higher has been expected to find application in a multimedia mobile telecommunications system, a radio LAN, an automotive collision avoidance radar, and the like. To provide an ultra-high frequency device using the milliwave band as its operating frequency range, it is essential to reduce the gate length. Specifically, it is necessary to implement a method of forming a gate with a length on the order of 0.1 to 0.2 μm. However, since gate resistance increases with a reduction in gate length, such a tendency toward a reduced gate length may cause the lowering of gain in the high frequency band and the degradation of noise immunity. As means for implementing both a reduced gate length and lowered gate resistance, a gate structure having a so-called T-shaped or mushroom-shaped configuration is effective, in which the lower part of a gate in contact with a substrate surface is scaled down and the upper part thereof is increased in cross-sectional area. The T-shaped gate structure is used widely in field-effect transistors (FETs) for ultra-high-frequency applications.

Referring to the drawings, a description will be given to a method of manufacturing a conventional semiconductor device having a T-shaped gate electrode. In the present application, the upper part of a T-shaped gate electrode having a T-shaped configuration which is formed relatively large for lower gate resistance is termed a "head portion" and the lower part of the T-shaped gate electrode which is formed relatively small for a shorter gate length is termed a "leg portion".

FIGS. 8(a) to 8(d) and FIGS. 9(a) to 9(c) show cross-sectional structures illustrating the individual process steps of a method of manufacturing a T-shaped gate electrode using electron beam (hereinafter referred to as EB) exposure for a conventional multi-layer resist. The example shown here uses typical polymethyl methacrylates (hereinafter referred to as PMMAs), which are different in sensitivity and formed in two layers.

First, as shown in FIG. 8(a), a lower-layer resist film 102 composed of the PMMA having a higher molecular weight and a lower sensitivity and an upper-layer resist film 103 composed of the PMMA having a lower molecular weight and a higher sensitivity are applied sequentially onto a semiconductor substrate 101. Then, as shown in FIG. 8(b), a first session of EB exposure is performed with respect to a region 103a of the upper-layer resist film 103 to be formed with the head portion of the gate electrode. As shown in FIG. 8(c), an opening 103b is formed in the upper-layer resist film 103 by developing the upper-layer resist film 103 and thereby removing the resist from the region 103a to be formed with the head portion.

Next, as shown in FIG. 8(d), a second session of EB exposure is performed with respect a region 102a of the lower-layer resist film 102 to be formed with the leg portion of the gate electrode. Then, as shown in FIG. 9(a), an opening 102b is formed in the lower-layer resist film 102 by removing the resist from the region 102a to be formed with the leg portion. As a result, a resist pattern for forming the T-shaped gate electrode is obtained in the opening 103b of the upper-layer resist film 103 and in the opening 102b of the lower-layer resist film 102.

Next, as shown in FIG. 9(b), a metal film 104A is vapor deposited over the entire surface of the semiconductor substrate 101. Subsequently, as shown in FIG. 9(c), the upper-layer and lower-layer resist films 103 and 102 are lifted off to provide the T-shaped gate electrode 104B formed of the metal film 104A.

However, the foregoing conventional method of manufacturing a semiconductor device having the T-shaped gate electrode has the following two problems.

First, since EB exposure is used for the exposure of the resist, equipment for EB exposure requires a tremendous investment, while the throughput thereof is low.

Second, the determinants of the gate length in the resist process are the widths of the openings in the resists composed of the PMMAs. However, if dry etching is performed for the purpose of preventing repellence of water during wet etching or the like, the gate length is increased disadvantageously due to a high etching rate and to low dry etching resistance of the PMMAs. Moreover, since the PMMAs have low heat resistance, the vapor deposition of metal on the PMMAs causes thermal deformation at the openings of the pattern.

SUMMARY OF THE INVENTION

It is therefore an object of the present invention to accomplish minute patterning with a high throughput by means of an i-line stepper, which is comparable to that accomplished by EB exposure.

To attain the above object, the formation of an extremely fine pattern for a semiconductor device according to the present invention includes the steps of:

(1) applying, onto a substrate, a resist film insensitive to an ultraviolet ray (i line);

(2) applying, onto the resist film, a buffer film and a transfer resist film sensitive to the ultraviolet ray, forming an opening pattern in the transfer resist film by using the ultraviolet ray, and transferring the opening pattern to the resist film; and (3) after removing the transfer resist film, applying a resist film for forming a mixing layer, which is of chemically amplified type and sensitive to the ultraviolet ray, to the entire surface of the resist film including the transferred opening pattern so as to form the mixing layer at the interface between the resist film and the resist film for forming the mixing layer.

Specifically, according to the present invention, a first method of manufacturing a semiconductor device in which a T-shaped gate electrode composed of a head portion and a leg portion extending downwardly from the head portion is formed on a semiconductor substrate, comprises the steps of: applying, onto the semiconductor substrate, a first resist film insensitive to an ultraviolet ray; forming, on the first resist film, a buffer film for preventing the first resist film and a second resist film to be applied onto the first resist film from being mixed with each other; applying, onto the buffer film, the second resist film sensitive to the ultraviolet ray; irradiating the second resist film with the ultraviolet ray to pattern the second resist film and developing the patterned second resist film to form a first opening in the second resist film; removing a region of the buffer film exposed in the first opening in the second resist film; etching the first resist film by using the second resist film and the buffer film as a mask to transfer, to the first resist film, a pattern of the first opening in the second resist film and thereby form a second opening in the first resist film; after removing the second resist film and the buffer film, applying a third resist film sensitive to the ultraviolet ray to the entire surface of the semiconductor substrate to form a mixing layer composed of a mixture of the first resist film and the third resist film at an interface between the first resist film and the third resist film; irradiating the third resist film with the ultraviolet ray to pattern the third resist film and developing the patterned third resist film to form, in the third resist film, an upper-layer opening as a region to be formed with the head portion of the gate electrode and form a lower-layer opening as a region to be formed with the leg portion of the gate electrode, the lower-layer opening being composed of the second opening in the first resist film having a wall face covered with the mixing layer; and filling a conductor film in the lower-layer and upper-layer openings over the semiconductor substrate to form the T-shaped gate electrode composed of the conductor film.

In accordance with the first method of manufacturing a semiconductor device, the wall face of the lower-layer opening is covered with the mixing layer composed of the mixture of the first resist film and the third resist film. Accordingly, the width of the lower-layer opening is reduced by the thickness of the mixing layer, which achieves a reduction in the width of the opening comparable to that achieved by EB exposure without using EB exposure. Moreover, since the buffer film is formed between the first resist film and the second resist film to prevent the first and second resist films from being mixed with each other, positive scaling down is achieved without deforming the second opening in the first resist film.

When PMMA is used for the first resist film, an extremely fine structure composed of the mixing layer is maintained reliably even during the manufacturing process since, in contrast to PMMA having rather inferior heat resistance and dry etching resistance, the mixing layer covering PMMA is generally superior to PMMA in terms of heat resistance and dry etching resistance.

A second method of manufacturing a semiconductor device according to the present invention comprises the steps of: applying, onto a semiconductor substrate, a first resist film insensitive to an ultraviolet ray; forming, on the first resist film, a buffer film for preventing the first resist film and a second resist film to be applied onto the first resist film from being mixed with each other; applying, onto the buffer film, the second resist film sensitive to the ultraviolet ray; irradiating the second resist film with an ultraviolet ray to pattern the second resist film and developing the patterned second resist film to form a first opening in the second resist film; removing a region of the buffer film exposed in the first opening in the second resist film; etching the first resist film by using the second resist film and the buffer film as a mask to transfer, to the first resist film, a pattern of the first opening in the second resist film and thereby form a second opening in the first resist film; after removing the second resist film and the buffer film, applying a third resist film sensitive to the ultraviolet ray to the entire surface of the semiconductor substrate to form a mixing layer composed of a mixture of the first resist film and the third resist film at an interface between the first resist film and the third resist film; developing the third resist film to form, in the first resist film, a third opening composed of the second opening having a wall face covered with the mixing layer; and filling a conductor film in the third opening over the semiconductor substrate to form a wiring pattern composed of the conductor film.

In accordance with the second method of manufacturing a semiconductor device, the wall face of the third opening is covered with the mixing layer composed of the mixture of the first resist film and the third resist film. Accordingly, the width of the third opening is reduced by the thickness of the mixing layer, which achieves a reduction in the width of the opening comparable to that achieved by EB exposure without using EB exposure. Moreover, since the buffer film is formed between the first resist film and the second resist film to prevent the first and second resist films from being mixed with each other, positive scaling down is achieved without deforming the second opening in the first resist film.

In the first or second method of manufacturing a semiconductor device, the first resist film is preferably composed of a resist containing polymethyl methacrylate. This allows positive formation of the mixing layer when TLOR is used for the third resist film. Here, TLOR designates a negative resist commercially available from Tokyo Ohka Kogyo Co., Ltd. under the trade name of TLOR-N001, which contains propylene glycol monomethyl ether acetate (PGMEA) and a methacrylic resin as main components.

In the first or second method of manufacturing a semiconductor device, the buffer film is preferably composed of a resist containing polydimethyl glutarimide. This prevents PMGI from being mixed with the first resist film insensitive to the ultraviolet ray, so that the first and second resist films are surely prevented from being mixed with each other. As a result, the first resist film can be formed into a desired pattern.

In the first or second method of manufacturing a semiconductor device, the buffer film is preferably composed of metal. In the arrangement, metal surely prevents the first and second resist films from being mixed with each other, so that the first resist pattern is formed into a desired pattern.

In the first or second method of manufacturing a semiconductor device, the second resist film is preferably composed of a resist containing ethyl cellosolve acetate and a novolac resin. In the arrangement, the resist positively reacts with the i line of ultraviolet rays, so that the second resist film is formed into a desired pattern by means of an i-line stepper.

In the first or second method of manufacturing a semiconductor device, the third resist film is preferably composed of a resist containing propylene glycol monomethyl ether acetate and a methacrylic resin. This allows positive formation of the mixing layer when PMMA is used for the first resist film.

BRIEF DESCRIPTION OF THE INVENTION

FIGS. 1(a) to 1(d) are structural cross-sectional views for illustrating the individual process steps of a method of manufacturing a field-effect transistor with a T-shaped gate electrode as a semiconductor device according to a first embodiment of the present invention;

FIGS. 2(a) to 2(d) are structural cross-sectional views for illustrating the individual process steps of the method of manufacturing the field-effect transistor with the T-shaped gate electrode as the semiconductor device according to the first embodiment;

FIGS. 3(a) to 3(d) are structural cross-sectional views for illustrating the individual process steps of the method of manufacturing the field-effect transistor with the T-shaped gate electrode as the semiconductor device according to the first embodiment;

FIGS. 4(a) and 4(b) are structural cross-sectional views for illustrating the individual process steps of the method of manufacturing the field-effect transistor with the T-shaped gate electrode as the semiconductor device according to the first embodiment;

FIGS. 5(a) to 5(c) are structural cross-sectional views for illustrating the individual process steps of a method of forming contact holes in a semiconductor device according to a second embodiment of the present invention;

FIGS. 6(a) to 6(c) are structural cross-sectional views for illustrating the individual process steps of the method of forming the contact holes in the semiconductor device according to the second embodiment;

FIGS. 7(a) to 7(c) are structural cross-sectional views for illustrating the individual process steps of the method of forming the contact holes in the semiconductor device according to the second embodiment;

FIGS. 8(a) to 8(d) are structural cross-sectional views for illustrating the individual process steps of a conventional method of forming a T-shaped gate electrode using EB exposure; and FIGS. 9(a) to 9(c) are structural cross-sectional views for illustrating the individual process steps of the conventional method of forming the T-shaped gate electrode using EB exposure.

DETAILED DESCRIPTION OF THE INVENTION

EMBODIMENT 1

Figure 1A:
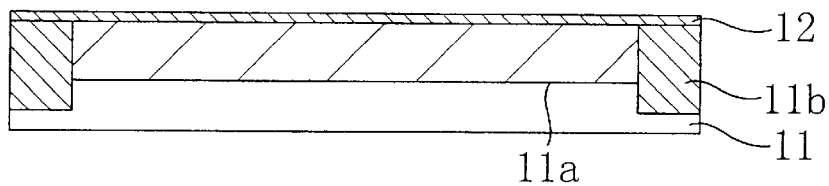

Referring now to the drawings, a first embodiment of the present invention will be described.

FIGS. 1(a) to 1(d), FIGS. 2(a) to 2(d), FIGS. 3(a) to 3(d), and FIGS. 4(a) and 4(b) show cross-sectional structures of a field-effect transistor with a T-shaped gate electrode in the individual process steps of a method of manufacturing a semiconductor device according to the first embodiment. First, as shown in FIG. 1(a), isolation regions 11b are formed selectively by implanting boron (B) ions or oxygen (O) ions into a GaAs substrate 11 having an epitaxial layer 11a grown in an upper portion thereof, which is composed of, e.g., a GaAs semiconductor crystal and forming a heterojunction. Instead of forming the isolation regions 11b, it is also possible to remove the isolation regions 11b by performing mesa etching with respect thereto. Subsequently, an insulating film 12 composed of SiN or the like and having a thickness of approximately 20 nm is formed on the top surface of the epitaxial layer 11a to enhance adhesion between the top surface of the substrate 11 and a resist film applied thereto.

Figure 1B:
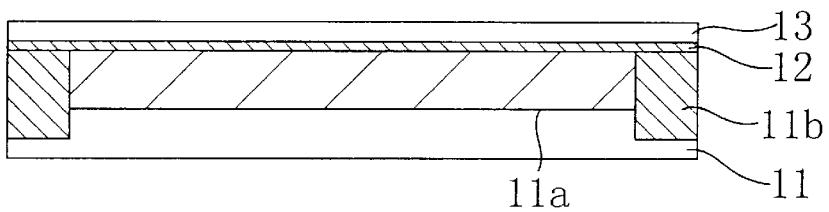

Next, as shown in FIG. 1(b), a first resist film 13 for EB exposure containing PMMA as a main component is applied and a specified baking process is performed with respect to the applied first resist film 13. The thickness of the first resist film 13 regulates the height of the T-shaped electrode. If the height of the leg portion of the T-shaped gate electrode is increased, parasitic capacitances between the gate electrode and the substrate and between the gate electrode and the ohmic electrode are reduced, so that the film thickness greatly affects a high-frequency operation. Conversely, if the thickness of the first resist film 13 is excessively increased, an aspect ratio between the film thickness and the gate length is increased, so that only an insufficient connection is provided between the leg portion of the T-shaped gate electrode and the head portion thereof, which increases gate resistance. Accordingly, the thickness of the first resist film 13 is adjusted to the order of 100 to 200 nm in the present embodiment.

Figure 1C:
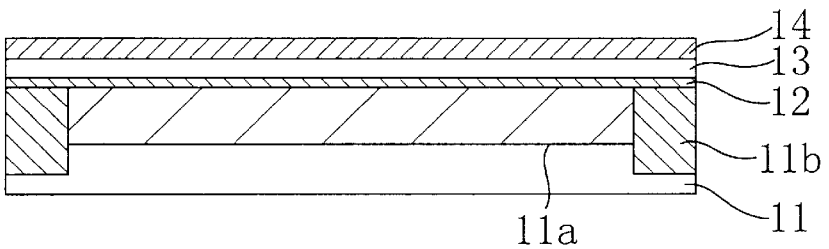

Next, as shown in FIG. 1(c), a buffer film 14 for EB exposure composed of a positive resist containing polydimethyl glutarimide (hereinafter referred to as PMGI) as a main component and nonmiscible with the first resist film 13 is applied to the top surface of the first resist film 13. The applied buffer film 14 is then subjected to a specified baking process similar to that performed with respect to the first resist film 13. To increase patterning accuracy, the thickness of the buffer film 14 is preferably minimized.

Figure 1D:
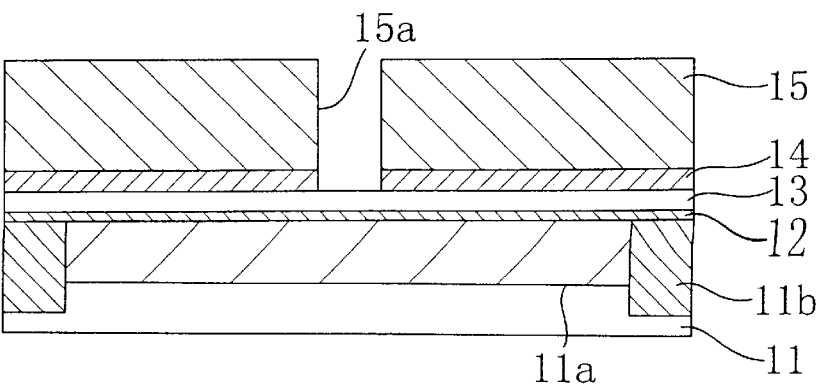

Next, as shown in FIG. 1(d), a second resist film 15 as a transfer resist film composed of THMR-ip3000, which is a positive resist sensitive to an i line and containing ethyl cellosolve acetate and a novolac resin as main components, is applied onto the buffer film 14. The i line is an ultraviolet ray with a wavelength of 365 nm. Thereafter, the second resist film 15 is exposed selectively by means of an i-line stepper and developed with tetramethylammonium hydroxide (hereinafter referred to as TMAH) as a developer such that the second resist film 15 is formed into a pattern with, e.g., a first opening 15a. Since etching also proceeds with respect to the buffer film 14 in TMAH as the developer, a developing time is controlled such that an opening equal in size to the first opening 15a of the second resist film 15 is also formed in the buffer film 14 as well as in the second resist film 15.

Figure 2A:
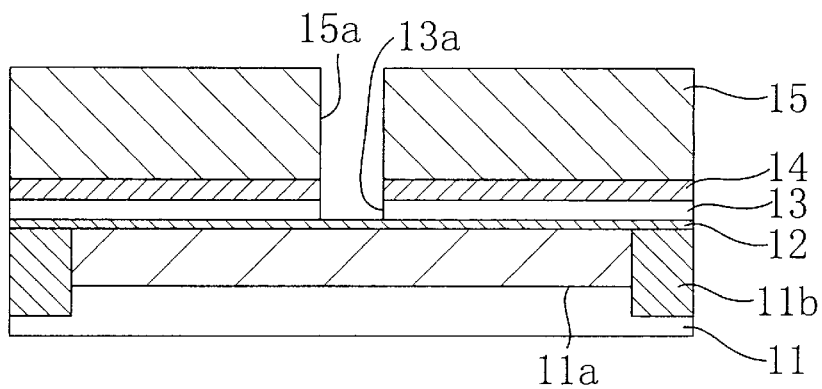

Next, as shown in FIG. 2(a), anisotropic dry etching using $O_2$ gas is performed with respect to the first resist film 13 by using the second resist film 15 having the first opening 15a as a mask such that a second opening 13a equal in size to the first opening 15a is formed in the first resist film 13, i.e., that the opening pattern is transferred.

Figure 2B:
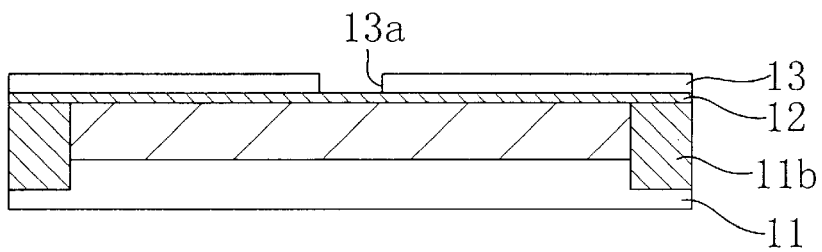

Next, as shown in FIG. 2(b), i-line exposure is performed with respect to the entire surface of the second resist film 15 by means of the i-line stepper by utilizing the fact that the first resist film 13 and the buffer film 14 are nonmiscible with each other and different developers are used. Subsequently, a developing process using TMAH as a developer is performed for about 5 minutes, thereby removing the second resist film 15 and the buffer film 14.

The foregoing process steps achieve the patterning of the first resist film 13 for EB exposure without using EB exposure. The second opening 13a has such a width as is regulated by a resolution limit for i-line patterning, which is normally on the order of 0.35 $\mu$m. If a phase shifting process is used, the width of the second opening 13a is on the order of 0.25 $\mu$m.

Figure 2C:
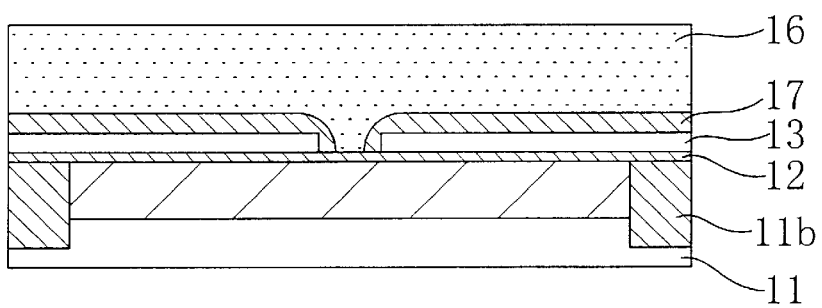

Next, as shown in FIG. 2(c), a third resist film 16 for i-line exposure, which is also for forming a mixing layer, is formed over the entire surface of the substrate 11. In the present embodiment, TLOR is used for the third resist film 16. The third resist film 16 regulates the height of the head portion of the T-shaped gate electrode. To reduce the gate resistance, it is generally required to adjust the thickness of a metal film for forming a gate electrode to 0.5 $\mu$m or more. In the present embodiment, the thickness of the third resist film 16 is adjusted to the order of 0.5 to 1.5 $\mu$m. Since TLOR used for the third resist film 16 is a chemically amplified resist, it is necessary to perform the process steps of prebaking, exposure, post-exposure baking (PEB), and development in succession after the application of TLOR.

As a result, a mixing layer 17 composed of a mixture of the third resist film 16 and the first resist film 13 is formed in the region of the third resist film 16 closer to the first resist film 13 in any of the process steps subsequent to the application of the third resist film 16, as shown in FIG. 2(c). The mixing layer 17 is also formed on the wall faces of the second opening 13a in the first resist film 13, so that the mixing layer 17 formed on the wall faces reduces the width of the second opening 13a in the first resist film 13 including the both wall faces by the order of 150 to 200 nm. Such an opening-width reducing effect promotes the reduction of a 0.35-µm pattern width, which is the resolution limit for normal i-line patterning, to the order of 0.15 µm.

Figure 2D:
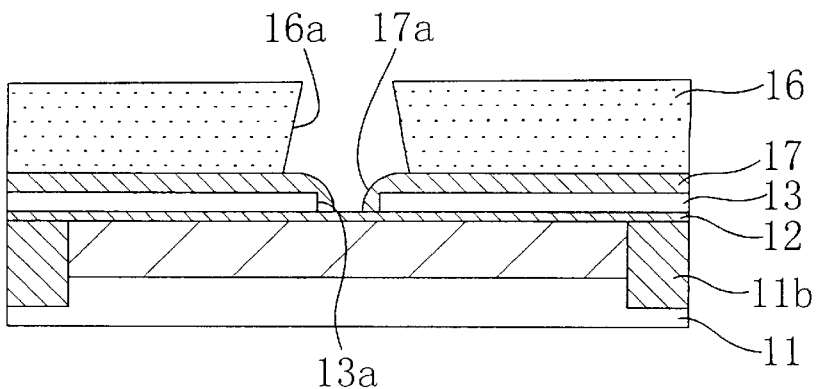

Next, as shown in FIG. 2(d), i-line exposure is performed with respect to the region of the third resist film 16 other than the region to be formed with the head portion of the T-shaped gate electrode, thereby patterning the third resist film 16. Thereafter, a specified developing process is performed to form, in the third resist film 16, an upper-layer opening 16a as the region to be formed with the head portion of the T-shaped gate electrode, while forming, in the second opening 13a of the first resist film 13, a lower-layer opening 17a as the region to be formed with the leg portion of the T-shaped gate electrode that has been scaled down with the side walls and peripheral portion of the second opening 13a covered with the mixing layer 17.

Figure 3A:
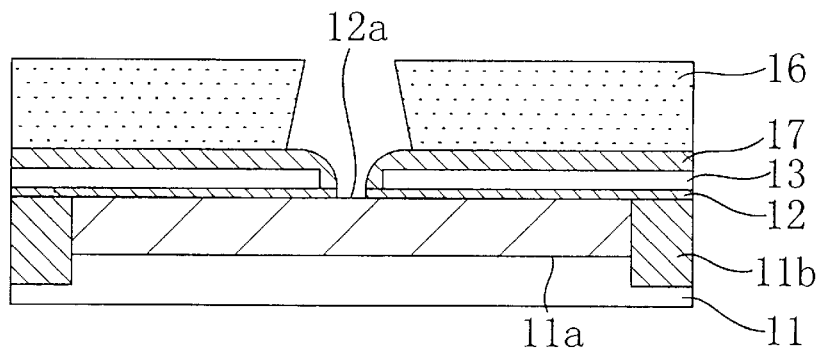

Next, as shown in FIG. 3(a), dry etching using such gas as carbon tetrafluoride ($CF_4$) is performed with respect to the region of the insulating film 12 exposed in the lower-layer opening 17a of the mixing layer 17 to form an opening 12a forming a part of the region to be formed with the leg portion. Thereafter, dry etching using an $O_2$ plasma is performed with respect to the region of the epitaxial layer 11a exposed in the opening 12a in order to prevent repellence of water in acidic treatment as a process step previous to dry recess etching. The mixing layer 17 is excellent in heat resistance and in dry etching resistance using an $O_2$ plasma or a $CF_4$ plasma compared with the case where a mixing layer composed only of PMMA is used. The provision of the mixing layer 17 prevents an increase in the size of the lower-layer opening 17a due to dry etching.

Figure 3B:
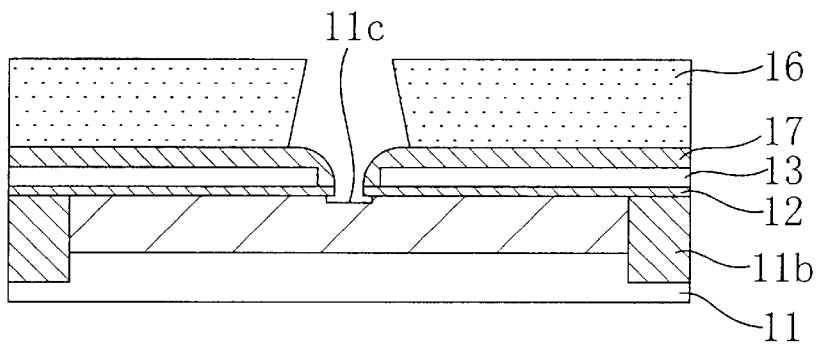
Figure 3C:
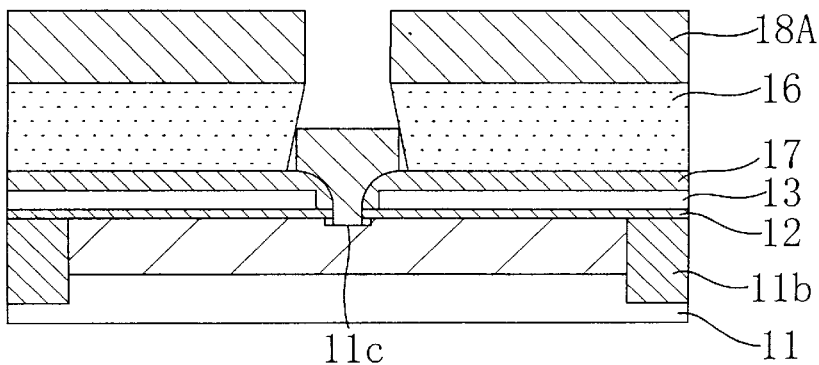
Figure 3D:
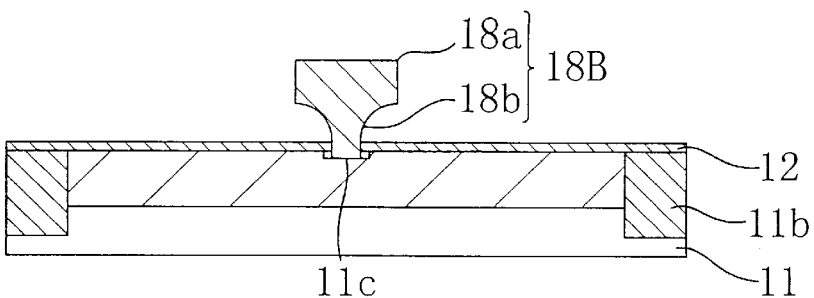

Next, as shown in FIG. 3(b), recess etching by dry recess is performed with respect to the epitaxial layer 11a to form a recess portion 11c for exposing a Schottky layer contained in the epitaxial layer 11a. Then, as shown in FIG. 3(c), a metal film 18A for forming a T-shaped gate electrode consisting of Ti/Pt/Au layers (50 nm/50 nm/400 nm) is formed by EB vapor deposition. Thereafter, the first resist film 13, the mixing layer 17, and the third resist film 16 are lifted off, as shown in FIG. 3(d), whereby a T-shaped gate electrode 18B composed of a head portion 18a and a leg portion 18b extending downwardly from the head portion 18a is formed from the metal film 18A.

Figure 4A:
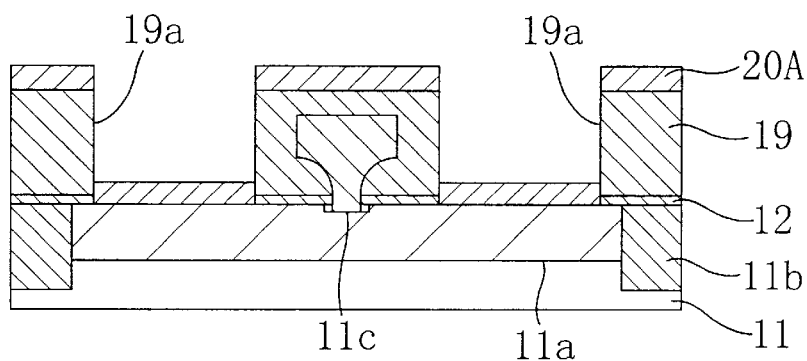
Figure 4B:
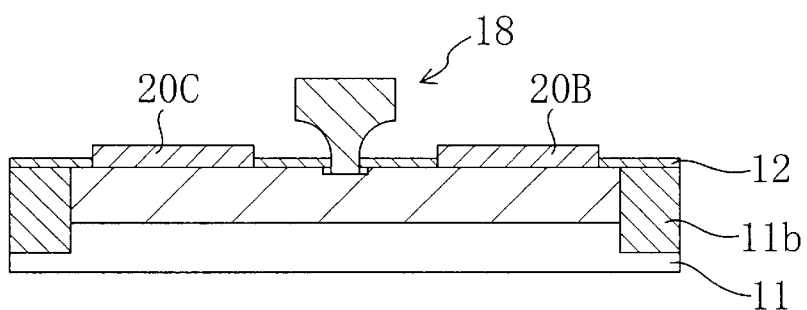

Next, as shown in FIG. 4(a), a resist pattern 19 having respective openings 19a in the source/drain electrode formation regions over the epitaxial layer 11a is formed. Then, dry etching using $CF_4$ gas is performed with respect to the insulating film 12, thereby removing the source/drain electrode formation regions from the insulating film 12. Subsequently, a metal film 20A containing, e.g., Au is formed by vapor deposition over the entire surface of the substrate 11. By lifting off the resist pattern 19, a source electrode 20B and a drain electrode 20C are formed from the metal film 20A, as shown in FIG. 4(b).

Thus, as shown in FIGS. 1(d) and 2(a), the present embodiment uses PMMA for EB exposure for the first resist film 13 to be formed with the opening for forming the leg portion 18b of the T-shaped gate electrode 18B and further stacks the second resist film 15 for i-line exposure on the first resist film 13 with the buffer film 14 interposed therebetween. Thereafter, i-line exposure is performed selectively with respect to the second resist film 15 to form the first opening 15a in the second resist film 15. The resulting opening pattern is transferred to the buffer film 14 and to the first resist film 13, whereby the second opening 13a is formed in the first resist film 13.

At this stage, the size of the second opening 13a in the first resist film 13 does not exceed the resolution limit of the i line. However, the size of the second opening 13a in the first resist film 13 is reduced by self alignment by applying, onto the first resist film 13, the third resist film 16 composed of TLOR of chemically amplified type forming the mixing layer 17 in conjunction with the first resist film 13, as shown in FIG. 2(c).

By thus using only i-line exposure which is simpler and higher in throughput, the T-shaped gate electrode 18B that has been scaled down comparably to a T-shaped gate electrode formed by using EB exposure can be formed without using EB exposure which is higher in cost and lower in throughput.

In addition, even if PMMA having inferior heat resistance and dry etching resistance is used for the first resist film 13, the extremely fine structure of the lower-layer opening 17a of the mixing layer 17 is maintained reliably without suffering deformation during the manufacturing process, since the PMMA composing the first resist film 13 including the second opening 13a is entirely covered with the mixing layer 17 having superior heat resistance and dry etching resistance.

Furthermore, since the upper-layer opening 16a as the region to be formed with the head portion of the T-shaped gate electrode 18B is smaller in size on the head-portion side than on the leg-portion side due to the use of a negative resist, as shown in FIG. 2(d), the metal film 18A can easily be removed from the head portion 18a of the T-shaped gate electrode 18B upon lifting off the third resist film 16.

VARIATION OF EMBODIMENT 1

Although the resist composed of PMGI for EB exposure has been used for the buffer film 14 in the first embodiment, a metal film composed of titanium (Ti) or aluminum (Al) and having a thickness on the order of 100 nm may also be used instead.

In this case, no opening is formed in the metal film in the step of forming the first opening 15a in the second resist film 15 illustrated in FIG. 1(d). Instead, an opening is formed in the metal film by anisotropic dry etching using $CF_4$ gas in the step of forming the second opening 13a in the first resist film 13 illustrated in FIG. 2(a).

Since the metal film is not removed during the step of removing the second resist film 15 by using TMAH as the developer illustrated in FIG. 2(b), an extra step should be performed subsequently such that the metal film is removed by using an aqueous solution of hydrogen fluoride (HF).

EMBODIMENT 2

A second embodiment will be described with reference to the drawings.

Although the manufacturing method described in the first embodiment has achieved a reduction in the gate length of a field-effect transistor, such holes as a contact hole for providing connection between a wiring pattern and the electrode of a transistor or the like and a via hole for providing connection between different wiring layers in a multi-layer wiring structure have also been scaled down increasingly.

Figure 5A:
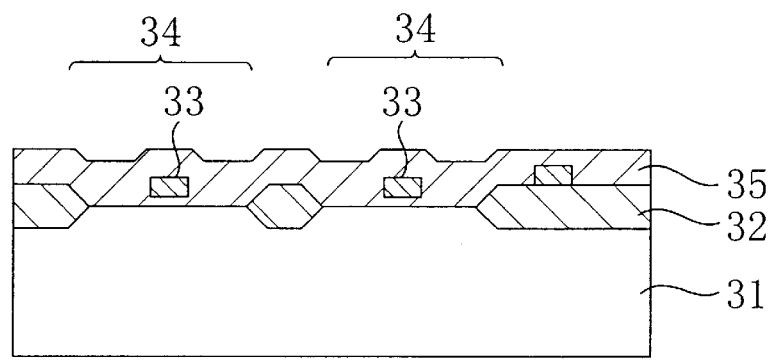

FIGS. 5(a) to 5(c), FIGS. 6(a) to 6(c), and FIGS. 7(a) to 7(c) show cross-sectional structures illustrating the individual process steps of a method of forming contact holes in a semiconductor device according to the second embodiment. As shown in FIG. 5(a), a substrate 31 composed of, e.g., silicon (Si) is formed with a plurality of MOSFETs 34 which are isolated from each other by a field oxide film 32 forming isolation regions and have respective gate electrodes 33 composed of polysilicon. An insulating film 35 composed of, e.g., silicon dioxide ($SiO_2$) is formed over the entire surface of the substrate 31.

Figure 5B:
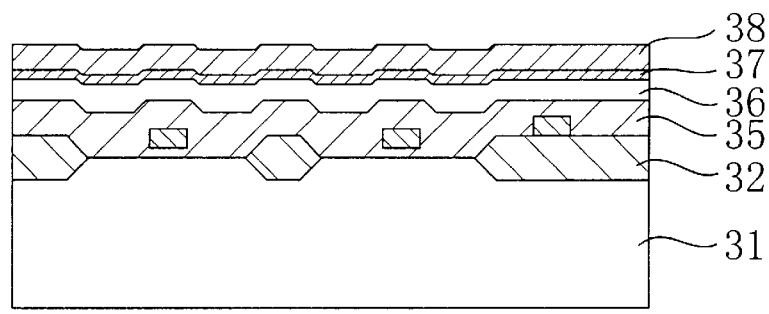

First, as shown in FIG. 5(b), a first resist film 36 for EB exposure containing PMMA as a main component is applied and a specified baking process is performed with respect to the applied first resist film 36. Subsequently, a buffer film 37 for EB exposure composed of a positive resist containing PMGI as a main component is applied to the top surface of the first resist film 36. The applied buffer film 37 is then subjected to a specified baking process similar to that performed with respect to the first resist film 36. Furthermore, a second resist film 38 composed of THMR-ip3000, which is a positive resist for i-line exposure, and serving as a transfer resist film is applied to the top surface of the buffer film 37. As stated previously, the buffer film 37 is for preventing the first resist film 36 from being mixed with the second resist film 38 applied onto the first resist film 36, so that the thickness of the buffer film 37 is preferably minimized.

Figure 5C:
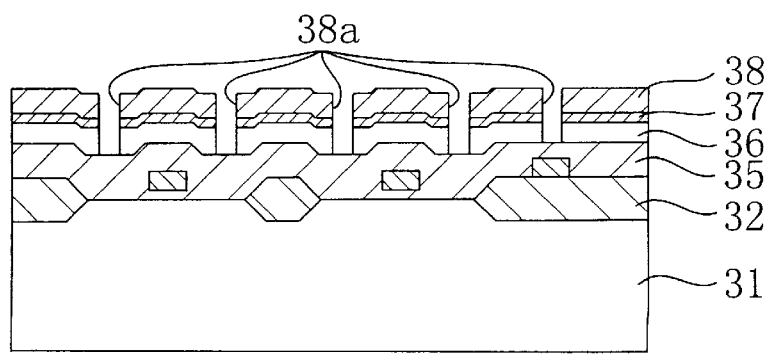

Next, as shown in FIG. 5(c), the second resist film 38 is selectively exposed by means of an i-line stepper and subjected to a developing process using TMAH as a developer such that the second resist film 38 is formed into a pattern with, e.g., first openings 38a. In the developing process, a developing time for the buffer film 37 is also controlled to form openings each equal in size to the first opening 38a of the second resist film 38.

Figure 6A:
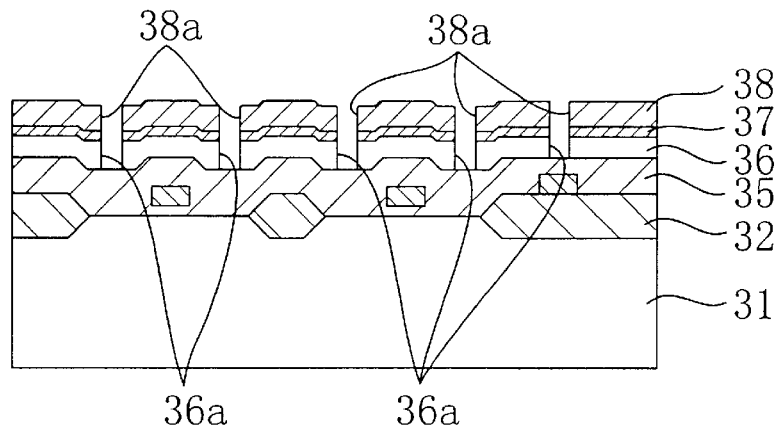

Next, as shown in FIG. 6(a), anisotropic dry etching using $O_2$ gas is performed with respect to the first resist film 36 by using the second resist film 38 with the first openings 38a as a mask such that second openings 36a equal in size to the first openings 38a are formed in the first resist film 36, i.e., that the opening pattern is transferred.

Figure 6B:
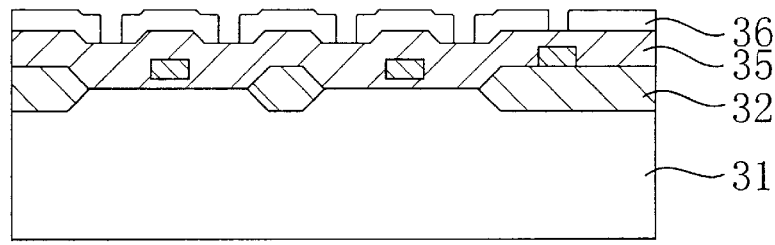

Next, as shown in FIG. 6(b), i-line exposure is performed with respect to the entire surface of the second resist film 38 by means of the i-line stepper by utilizing the fact that the first resist film 36 and the buffer film 37 are nonmiscible with each other and different developers are used. Subsequently, a developing process using TMAH as a developer is performed for about 5 minutes, thereby removing the second resist film 38.

The foregoing process steps achieve the patterning of the first resist film 36 for EB exposure without performing EB exposure. The second opening 36a has such a width as is regulated by a resolution limit for i-line patterning, which is normally on the order of 0.35 $\mu$m. If a phase shifting process is used, the width of the second opening 36a is on the order of 0.25 $\mu$m.

Figure 6C:
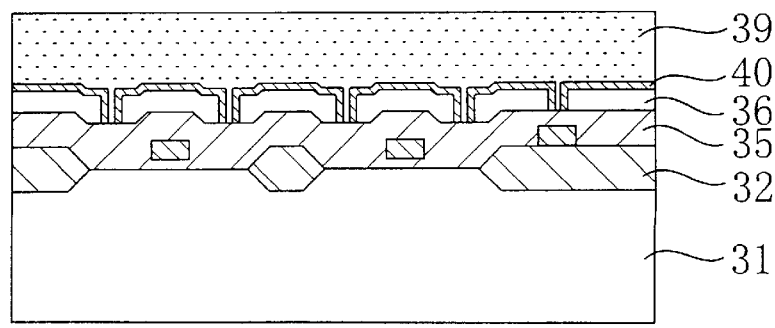

Next, as shown in FIG. 6(c), a third resist film 39 using TLOR, which is a negative resist for i-line exposure and also for forming a mixing layer, is formed over the entire surface of the substrate 31. Since TLOR is a chemically amplified resist, it is normally necessary to perform the process steps of prebaking, exposure, post-exposure baking (PEB), and development in succession after the application of TLOR.

As a result, a mixing layer 40 composed of a mixture of the third resist film 39 and the first resist film 36 is formed in the region of the third resist film 39 closer to the first resist film 36 in any of the process steps subsequent to the application of the third resist film 39, as shown in FIG. 6(c).

The mixing layer 40 is also formed on the wall faces of each of the second openings 36a in the first resist film 36, so that the mixing layer 40 formed on the wall faces reduces the width of the second opening 36a in the first resist film 36 including the both wall faces by the order of 150 to 200 nm. Such an opening-width reducing effect promotes the reduction of a 0.35-$\mu$m pattern width, which is the resolution limit for normal i-line patterning, to the order of 0.15 $\mu$m.

Since the third resist film 39 needs no patterning, a developing process is performed without exposing the third resist film 39.

Figure 7A:
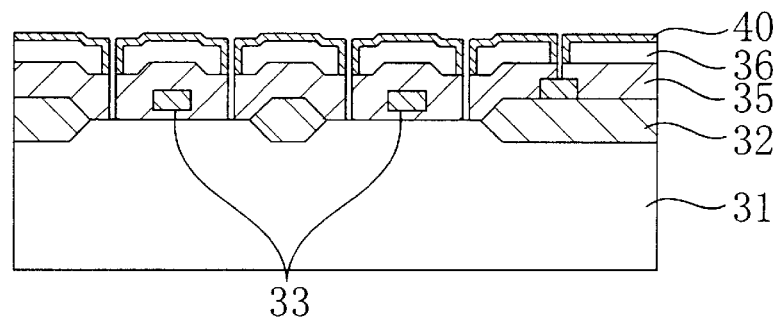
Figure 7B:
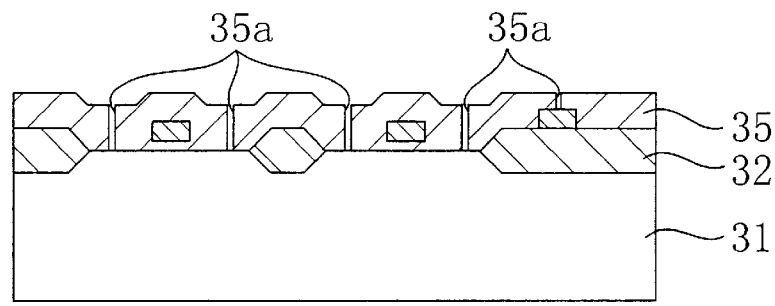

Next, as shown in FIG. 7(a), anisotropic dry etching using $CF_4$ gas or the like is performed with respect to the insulating film 35 by using, as a mask, the first resist film 36 and the mixing layer 40 for protecting and scaling down the first resist film 36. Thereafter, the first resist film 36 and the mixing layer 40 are removed, as shown in FIG. 7(b), whereby the contact holes 35a as the third opening are formed in the insulating film 35.

Figure 7C:
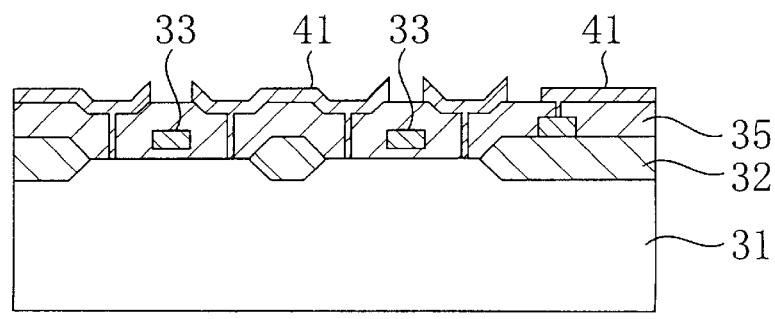
Figure 8A:
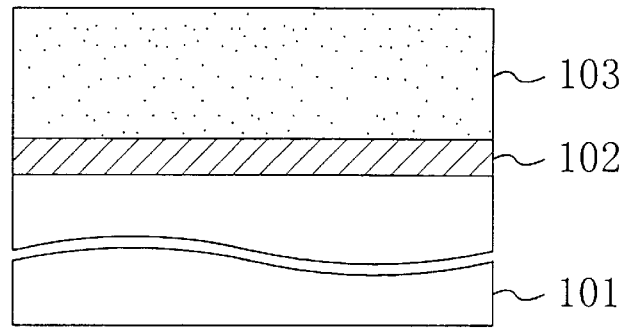
Figure 8B:
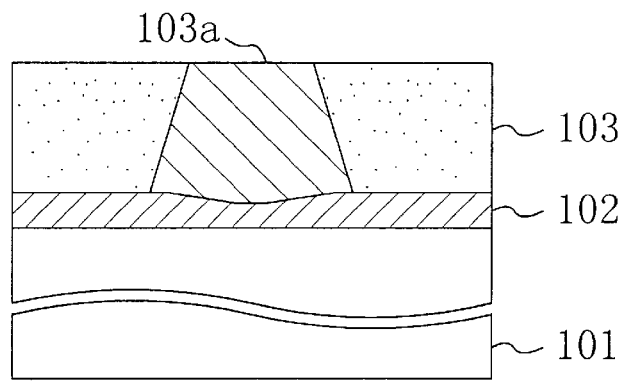
Figure 8C:
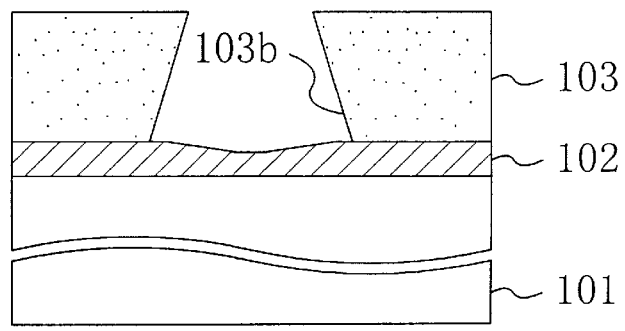
Figure 8D:
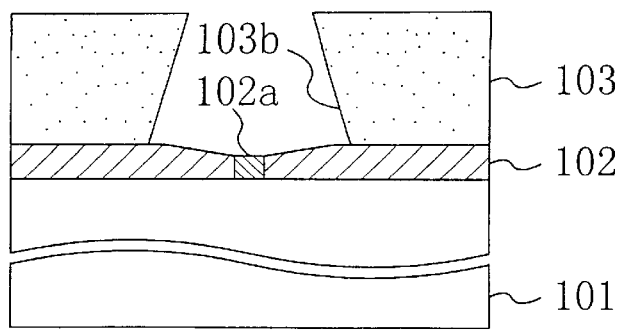
Figure 9A:
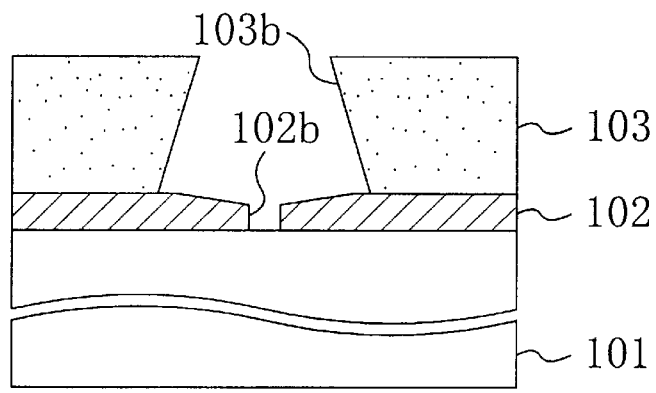
Figure 9B:
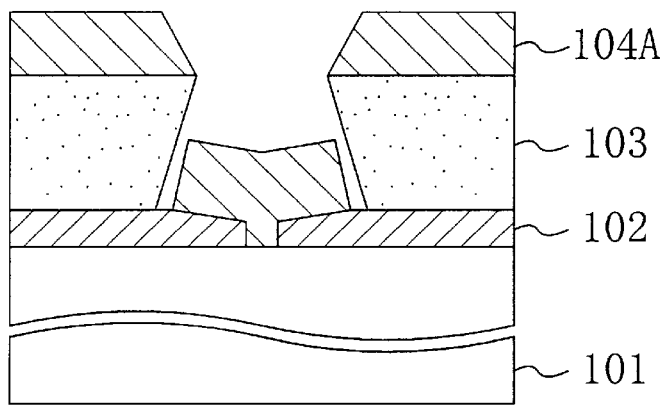
Figure 9C:
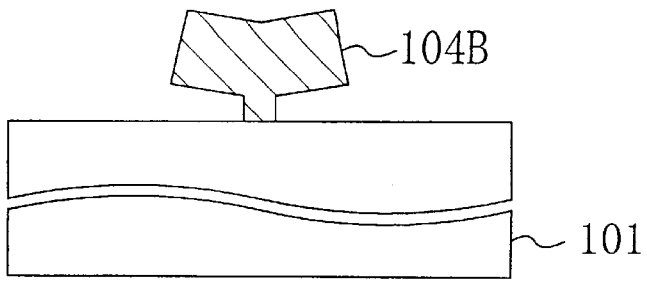

Next, as shown in FIG. 7(c), a metal film composed of a Ti/TiN/Al—Cu multi-layer structure is vapor deposited by, e.g., sputtering over the entire surface of the substrate 31 and patterned by photolithography, thereby forming a wiring pattern 41.

Thus, as shown in FIG. 5(b), the present embodiment uses PMMA for EB exposure for the first resist film 36 to be formed with the openings for contact holes and stacks the second resist film 38 for i-line exposure on the first resist film 36 with the buffer film 37 interposed therebetween. Thereafter, i-line exposure is performed selectively with respect to the second resist film 38, as shown in FIGS. 5(c) and 6(a), to form the first openings 38a. The resulting opening pattern is transferred to the buffer film 37 and to the first resist film 36, whereby the second openings 36a are formed in the first resist film 36.

At this stage, the size of the second opening 36a in the first resist film 36 does not exceed the resolution limit of the i line. However, the size of the second opening 36a in the first resist film 36 is reduced by self alignment by applying, onto the first resist film 36, the third resist film 39 composed of TLOR of chemically amplified type forming the mixing layer 40 in conjunction with the first resist film 36, as shown in FIG. 6(c).

By thus using only i-line exposure which is simpler and higher in throughput, the contact holes 35a that have been scaled down comparably to contact holes formed by using EB exposure can be formed without using EB exposure which is higher in cost and lower in throughput.

In addition, even if PMMA that is inferior in heat resistance and dry etching resistance is used for the first resist film 36, the extremely fine structure formed of the mixing layer 40 is maintained reliably without suffering deformation during the manufacturing process, since the PMMA composing the first resist film 36 including the second opening 36a is entirely covered with the mixing layer 40 having superior heat resistance and dry etching resistance.

Although the present embodiment has shown only the wiring pattern 41 composed of a single layer, it will be appreciated that the present invention is also applicable to a multi-layer wiring pattern.

Although the present embodiment has described, by way of example, the scaling down of the contact holes 35a for providing electrical connection between the electrodes of the MOSFETs 34 on the substrate 31 and the wiring pattern 41 provided on the top surface of the insulating film 35, the present invention is not limited thereto but is also applicable to via holes and the scaling down of the wiring pattern itself.

What is claimed is:

1. A method of manufacturing a semiconductor device in which a T-shaped gate electrode composed of a head portion and a leg portion extending downwardly from said head portion is formed on a semiconductor substrate, comprising the steps of:

applying, onto said semiconductor substrate, a first resist film insensitive to an ultraviolet ray;

forming, on said first resist film, a buffer film for preventing said first resist film and a second resist film to be applied onto said first resist film from being mixed with each other;

applying, onto said buffer film, said second resist film sensitive to the ultraviolet ray;

irradiating said second resist film with the ultraviolet ray to pattern said second resist film and developing said patterned second resist film to form a first opening in said second resist film;

removing a region of said buffer film exposed in said first opening in said second resist film;

etching said first resist film by using said second resist film and said buffer film as a mask to transfer, to said first resist film, a pattern of said first opening in said second resist film and thereby form a second opening in said first resist film;

after removing said second resist film and said buffer film, applying a third resist film sensitive to the ultraviolet ray to the entire surface of said semiconductor substrate to form a mixing layer composed of a mixture of said first resist film and said third resist film at an interface between said first resist film and said third resist film;

irradiating said third resist film with the ultraviolet ray to pattern said third resist film and developing said patterned third resist film to form, in said third resist film, an upper-layer opening as a region to be formed with the head portion of said gate electrode and form a lower-layer opening as a region to be formed with the leg portion of said gate electrode, said lower-layer opening being composed of said second opening in said first resist film having a wall face covered with said mixing layer; and filling a conductor film in said lower-layer and upper-layer openings over said semiconductor substrate to form the T-shaped gate electrode composed of said conductor film.

2. The method of manufacturing a semiconductor device according to claim 1, wherein said first resist film is composed of a resist containing polymethyl methacrylate.

3. The method of manufacturing a semiconductor device according to claim 1, wherein said buffer film is composed of a resist containing polydimethyl glutarimide.

4. The method of manufacturing a semiconductor device according to claim 1, wherein said buffer film is composed of metal.

5. The method of manufacturing a semiconductor device according to claim 1, wherein said second resist film is composed of a resist containing ethyl cellosolve acetate and a novolac resin.

6. The method of manufacturing a semiconductor device according to claim 1, wherein said third resist film is composed of a resist containing propylene glycol monomethyl ether acetate and a methacrylic resin.

7. A method of manufacturing a semiconductor device, comprising the steps of:

applying, onto a semiconductor substrate, a first resist film insensitive to an ultraviolet ray;

forming, on said first resist film, a buffer film for preventing said first resist film and a second resist film to be applied onto said first resist film from being mixed with each other;

applying, onto said buffer film, said second resist film sensitive to the ultraviolet ray;

irradiating said second resist film with an ultraviolet ray to pattern said second resist film and developing said patterned second resist film to form a first opening in said second resist film;

removing a region of said buffer film exposed in said first opening in said second resist film;

etching said first resist film by using said second resist film and said buffer film as a mask to transfer, to said first resist film, a pattern of said first opening in said second resist film and thereby form a second opening in said first resist film;

after removing said second resist film and said buffer film, applying a third resist film sensitive to the ultraviolet ray to the entire surface of said semiconductor substrate to form a mixing layer composed of a mixture of said first resist film and said third resist film at an interface between said first resist film and said third resist film;

developing said third resist film to form, in said first resist film a third opening composed of said second opening having a wall face covered with said mixing layer; and filling a conductor film in said third opening over said semiconductor substrate to form a wiring pattern composed of said conductor film.

8. The method of manufacturing a semiconductor device according to claim 7, wherein said first resist film is composed of a resist containing polymethyl methacrylate.

9. The method of manufacturing a semiconductor device according to claim 7, wherein said buffer film is composed of a resist containing polydimethyl glutarimide.

10. The method of manufacturing a semiconductor device according to claim 7, wherein said buffer film is composed of metal.

11. The method of manufacturing a semiconductor device according to claim 7, wherein said second resist film is composed of a resist containing ethyl cellosolve acetate and a novolac resin.

12. The method of manufacturing a semiconductor device according to claim 7, wherein said third resist film is composed of a resist containing propylene glycol monomethyl ether acetate and a methacrylic resin.

* * * * *